United States Patent
Lee et al.

(10) Patent No.: US 10,784,179 B2
(45) Date of Patent: Sep. 22, 2020

(54) SEMICONDUCTOR DEVICE AND METHOD FOR FABRICATING THE SAME

(71) Applicant: ELECTRONICS AND TELECOMMUNICATIONS RESEARCH INSTITUTE, Daejeon (KR)

(72) Inventors: Hyung Seok Lee, Daejeon (KR); Zin-Sig Kim, Daejeon (KR); Sung-Bum Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/839,964

(22) Filed: Apr. 3, 2020

(65) Prior Publication Data

US 2020/0235028 A1    Jul. 23, 2020

Related U.S. Application Data

(62) Division of application No. 16/134,286, filed on Sep. 18, 2018, now Pat. No. 10,651,107.

(30) Foreign Application Priority Data

Sep. 26, 2017  (KR) .......................... 10-2017-0124569
Jan. 16, 2018  (KR) .......................... 10-2018-0005704

(51) Int. Cl.
*H01L 23/367*  (2006.01)
*H01L 23/00*   (2006.01)
(Continued)

(52) U.S. Cl.
CPC ........ *H01L 23/367* (2013.01); *H01L 23/5385* (2013.01); *H01L 24/24* (2013.01);
(Continued)

(58) Field of Classification Search
CPC . H01L 51/56; H01L 51/0072; H01L 51/0097; H01L 51/5253; C09K 11/06
(Continued)

(56) References Cited

U.S. PATENT DOCUMENTS 9,818,692 B2    11/2017  Roberts et al.
2005/0067716 A1  3/2005  Mishra et al.
(Continued)

FOREIGN PATENT DOCUMENTS

KR    2012-0054495 A    5/2012
KR    2012-0136207 A   12/2012
KR    2015-0066148 A    6/2015

*Primary Examiner* — Andy Huynh
(74) *Attorney, Agent, or Firm* — Rabin & Berdo, P.C.

(57) ABSTRACT

A method for fabricating a semiconductor device includes sequentially laminating a separation layer and a first substrate layer on a sacrificial substrate, and forming a heat dissipation plate comprising a first region and a second region on the first substrate layer. The method further includes removing the sacrificial substrate and the separation layer, and patterning the first substrate layer to form a first substrate exposing the heat dissipation plate in the second region and contacting the heat dissipation plate in the first region, and forming a first element on the first substrate. The method still further includes forming a plurality of conductive pads disposed on the heat dissipation plate in the second region and a first line connecting at least one of the plurality of conductive pads to the first element, and forming a second element on the conductive pads in the second region.

10 Claims, 5 Drawing Sheets

(51) Int. Cl.
*H01L 23/538* (2006.01)
*H01L 25/065* (2006.01)
*H01L 29/778* (2006.01)
*H01L 29/20* (2006.01)
*H01L 23/373* (2006.01)

(52) U.S. Cl.
CPC ...... *H01L 25/0657* (2013.01); *H01L 23/3732* (2013.01); *H01L 23/5386* (2013.01); *H01L 24/05* (2013.01); *H01L 24/13* (2013.01); *H01L 24/16* (2013.01); *H01L 25/0655* (2013.01); *H01L 29/2003* (2013.01); *H01L 29/7786* (2013.01); *H01L 2224/0401* (2013.01); *H01L 2224/051* (2013.01); *H01L 2224/056* (2013.01); *H01L 2224/05563* (2013.01); *H01L 2224/05573* (2013.01); *H01L 2224/13111* (2013.01); *H01L 2224/13116* (2013.01); *H01L 2224/13144* (2013.01); *H01L 2224/13147* (2013.01); *H01L 2224/16227* (2013.01); *H01L 2224/24226* (2013.01); *H01L 2225/06513* (2013.01); *H01L 2924/1033* (2013.01); *H01L 2924/10253* (2013.01); *H01L 2924/1306* (2013.01); *H01L 2924/1423* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01)

(58) Field of Classification Search
USPC .......................................................... 257/76
See application file for complete search history.

(56) References Cited

U.S. PATENT DOCUMENTS

| | | |
|---|---|---|
| 2011/0062579 A1 | 3/2011 | Mishra et al. |
| 2017/0186672 A1* | 6/2017 | Yamada ................. H01L 27/14 |
| 2017/0213904 A1 | 7/2017 | Na et al. |
| 2017/0256656 A1 | 9/2017 | Park et al. |

* cited by examiner

ND METHOD
SEMICONDUCTOR DEVICE AND METHOD FOR FABRICATING THE SAME

CROSS-REFERENCE TO RELATED APPLICATIONS

The present application is a Divisional Application of co-pending U.S. application Ser. No. 16/134,286, filed on Sep. 18, 2018, and claims priority under 35 U.S.C. § 119 of Korean Patent Application Nos. 10-2017-0124569, filed on Sep. 26, 2017, and 10-2018-0005704, filed on Jan. 16, 2018, the entire contents of which are hereby incorporated by reference.

BACKGROUND

The present disclosure herein relates to a semiconductor device and a method for fabricating the same.

Among nitride semiconductors, particularly, a gallium nitride semiconductor is a wide band gap semiconductor, which has higher electric field strength (about $3.0 \times 10^6$ V/cm) and higher electron mobility (500 cm$^2$/Vs at 300K) than those of a silicon semiconductor and thus is being attracted attention as a next-generation RF and power semiconductor material. The nitride semiconductor may be a power semiconductor and used as a normally-off device by being connected to other semiconductor devices. Also, the nitride semiconductor may be used as a core component of a wireless communication terminal transceiver through configuration with passive/active devices.

SUMMARY

The present disclosure provides a highly integrated semiconductor device having improved reliability.

The present disclosure also provides a method for fabricating a semiconductor device, which is capable of reducing fabrication cost and improving yield.

An embodiment of the inventive concept provides a semiconductor device including: a heat dissipation plate including a first region and a second region; a first element disposed on the heat dissipation plate in the first region; and a second element disposed on the heat dissipation plate in the second region, wherein the first element includes a first substrate, the second element includes a second substrate, the first substrate includes a material different from a material of the second substrate, the first substrate contacts the heat dissipation plate, and the second element is bonded to the heat dissipation plate by a flip-chip bonding manner.

In an embodiment, the first substrate may include silicon, and the second substrate may include gallium nitride.

In an embodiment, the first element may include a silicon field effect transistor, and the second element may include a gallium nitride field effect transistor.

In an embodiment, the first element may further include a first source electrode, a first drain electrode, and a first gate electrode between the first source electrode and the first drain electrode, which are disposed on the first substrate, the second element may further include a second source electrode, a second drain electrode, and a second gate electrode between the second source electrode and the second drain electrode, which are disposed on the second substrate, and the second source electrode, the second drain electrode, and the second gate electrode may be disposed between the second substrate and the heat dissipation plate.

In an embodiment, the semiconductor device may further include: a first line contacting the first source electrode to extend to a surface of the heat dissipation plate in the second region; and a second line contacting the first drain electrode to extend to the surface of the heat dissipation plate in the second region, wherein one of the second source electrode, the second drain electrode, and the second gate electrode may be connected to the first line, and another of the second source electrode, the second drain electrode, and the second gate electrode may be connected to the second line.

In an embodiment, the first line and the second line may cover a side surface of the first substrate.

In an embodiment, the first substrate may expose a surface of the heat dissipation plate in the second region.

In an embodiment, the heat dissipation plate may include diamond.

In an embodiment, the heat dissipation plate may include a third region spaced apart from the first region with the second region therebetween, the semiconductor device may further include a third element disposed in the third region, and the first substrate and the third substrate may include the same material. In an embodiment, the second element may include a gallium nitride field effect transistor, the first element and the third element may be electrically connected to the second element, and each of the first element and the third element may include one selected from a capacitor, an inductor, and a resistor.

In an embodiment of the inventive concept, a method for fabricating a semiconductor device includes: sequentially laminating a separation layer and a first substrate layer on a sacrificial substrate; forming a heat dissipation plate including a first region and a second region on the first substrate layer; removing the sacrificial substrate and the separation layer; patterning the first substrate layer to form a first substrate exposing the heat dissipation plate in the second region and contacting the heat dissipation plate in the first region; forming a first element on the first substrate; forming a plurality of conductive pads disposed on the heat dissipation plate in the second region and a first line connecting at least one of the plurality of conductive pads to the first element; and forming a second element on the conductive pads in the second region.

In an embodiment, the first substrate layer may include a silicon layer, and the separation layer may include a silicon oxide layer, and the sacrificial substrate on which the separation layer and the first substrate layer are sequentially laminated may be a silicon on insulator (SOI) substrate.

In an embodiment, the forming of the heat dissipation layer may include depositing diamond.

In an embodiment, the method may further include decreasing a thickness of the first substrate layer before the forming of the heat dissipation plate.

In an embodiment, the forming of the second element on the conductive pads in the second region may be performed by a flip-chip bonding manner.

In an embodiment, the second element may include a second substrate and second electrodes disposed on the second substrate and spaced apart from each other, and the connecting of the second element to the conductive pads in the second region may include interposing a solder layer to connect the conductive pads to the second electrodes.

In an embodiment, the heat dissipation plate may further include a third region spaced apart from the first region with the second region therebetween, and the patterning of the first substrate layer may further include forming a second substrate contacting the heat dissipation plate in the third region.

In an embodiment, the method may, before the connecting of the second element, further include: forming a third element on the second substrate; and forming a second line connecting some of the conductive pads to the third element.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
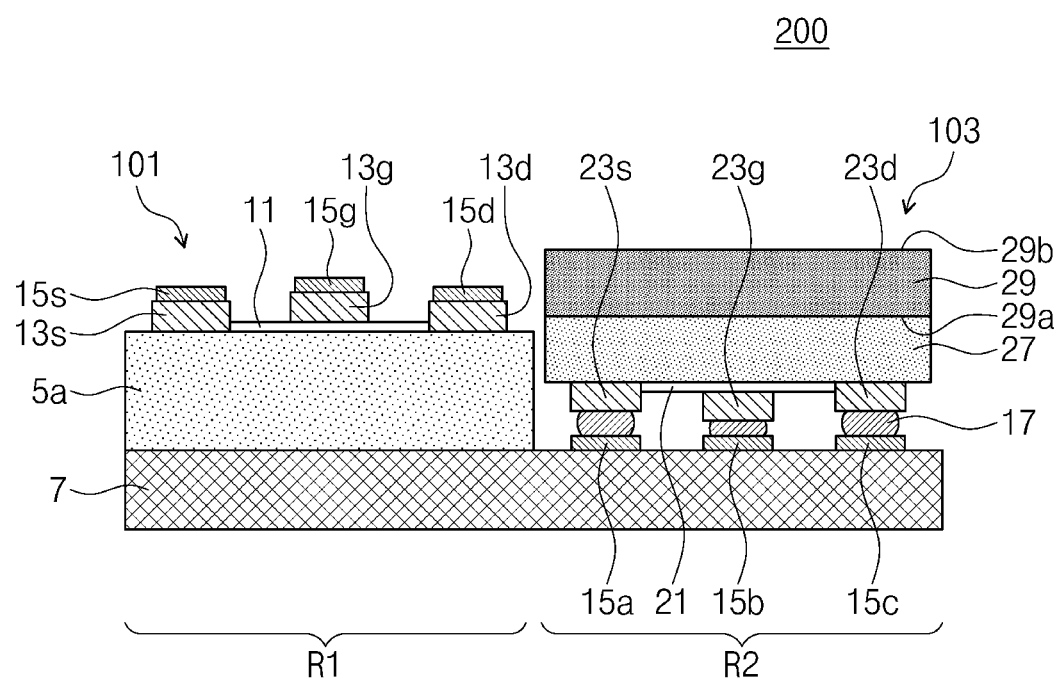
FIG. 1 is a cross-sectional view of a semiconductor device according to embodiments of the inventive concept.

The objects, other objectives, features, and advantages of the inventive concept will be understood without difficulties through preferred embodiments below related to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art.

In this specification, it will also be understood that when another component is referred to as being 'on' one component, it can be directly on the one component, or an intervening third component may also be present. Also, in the figures, the dimensions of layers and regions are exaggerated for clarity of illustration.

The embodiment in the detailed description will be described with cross-sectional views and/or plan views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may be rounded or have a shape with a predetermine curvature. Areas exemplified in the drawings have general properties and are used to illustrate a specific shape of a device. Thus, this should not be construed as limited to the scope of the inventive concept. Also, though terms like a first and a second are used to describe various regions and layers in various embodiments of the inventive concept, the regions and the layers are not limited to these terms. These terms are only used to distinguish one component from another component. Embodiments described and exemplified herein include complementary embodiments thereof.

In the following description, the technical terms are used only for explaining a specific exemplary embodiment while not limiting the inventive concept. In this specification, the terms of a singular form may include plural forms unless specifically mentioned. The meaning of 'comprises' and/or 'comprising' does not exclude other components besides a mentioned component.

Hereinafter, embodiments of the inventive concept will be described in detail with reference to the accompanying drawings.

FIG. 1 is a cross-sectional view of a semiconductor device according to embodiments of the inventive concept.

Referring to FIG. 1, a semiconductor device 200 according to this embodiment may include a heat dissipation plate 7. The heat dissipation plate 7 may be made of, for example, diamond. The diamond has thermal conductivity of about 2,200 W/mK, i.e., has the most excellent (highest) thermal conductivity among the materials. Thus, when the diamond is used for the heat dissipation plate, a very excellent heat dissipation effect may be expected. The heat dissipation plate 7 may have a thickness of about 50 µm to about 1 cm, more particularly, a thickness of about 100 µm to about 5 cm. The heat dissipation plate 7 may include a first region R1 and a second region R2. In the first region R1, a first element 101 may be disposed on the heat dissipation plate 7. In the second region R2, a second element 103 may be disposed on the heat dissipation plate 7.

For example, the first element 101 may be a silicon field effect transistor. The first element 101 may include a first substrate 5a. The first substrate 5a may contact the heat dissipation plate 7. The first substrate 5a may expose a surface of the heat dissipation plate 7 in the second region R2. A top surface of the first substrate 5a in the first region R1 and a surface of the heat dissipation plate 7 in the second region R2 may have a height difference with respect to each other. For example, the first substrate 5a may be made of a silicon single crystal. Although not shown, impurity injection regions may be defined in the first substrate 5a. Some of the impurity injection regions may be doped with N-type impurities. The other of the impurity injection regions may be doped with P-type impurities. The impurity injection regions may be well regions or include source/drain regions.

The first element 101 may further include first electrodes 13s, 13d, and 13g disposed on the first substrate 5a and spaced apart from each other. The first electrodes 13s, 13d, and 13g may include a first source electrode 13s, a first drain electrode 13d, and a first gate electrode 13g. Each of the first electrodes 13s, 13d, and 13g may include at least one material of polysilicon doped with impurities, titanium, aluminum, gold, copper, tungsten, nickel, or platinum. A first gate insulation layer 11 may be disposed between the first gate electrode 13g and the first substrate 5a. The first gate insulation layer 11 may be made of, for example, at least one of silicon oxide, silicon nitride, silicon oxynitride, or metal oxide. The first source electrode 13s and the first drain electrode 13d may contact the first substrate 5a.

The second element 103 may be, for example, a gallium nitride field effect transistor. The second element 103 may include second substrates 27 and 29. The second substrates 27 and 29 may include a first sub-substrate layer 29 and a second sub-substrate layer 27. The first sub-substrate layer 29 may include a first surface 29a and a second surface 29b, which face each other. The second sub-substrate layer 27 may be disposed on the first surface 29a of the first sub-substrate layer 29. The first surface 29a may be closer to the heat dissipation plate 7 than the second surface 29b. The first sub-substrate layer 29 may include, for example, silicon, silicon carbide (SiC), or aluminum oxide (or sapphire). The second sub-substrate layer 27 may include, for example, gallium nitride layer (GaN) and an aluminum gallium nitride layer (AlGaN), which are sequentially laminated. That is, the gallium nitride layer may contact the first surface 29a, and the aluminum gallium nitride layer may be spaced apart from the first surface 29a. The gallium nitride layer and the aluminum gallium nitride layer may be formed by an epitaxial process. A two dimensional electron gas (2DEG) layer may be formed in the second sub-substrate layer 27 due to a difference in crystal lattice size between the gallium nitride layer and the aluminum gallium nitride layer. This may serve to improve a transfer rate of charges when the second element 103 is driven subsequently.

The second element 103 may include second electrodes 23s, 23d, and 23g disposed on the second sub-substrate layer 27 and spaced apart from each other. The second electrodes 23s, 23d, and 23g may include a second source electrode 23s, a second drain electrode 23d, and a second gate electrode 23g. Each of the second electrodes 23s, 23d, and 23g may include at least one material of polysilicon doped with impurities, titanium, aluminum, gold, copper, tungsten, nickel, or platinum. A second gate insulation layer 21 may be disposed between the second gate electrode 23g and the second sub-substrate layer 27. The second gate insulation layer 21 may be made of, for example, at least one of silicon oxide, silicon nitride, silicon oxynitride, or metal oxide. The second source electrode 23s and the second drain electrode 23d may contact the second sub-substrate layer 27. The second electrodes 23s, 23d, and 23g may be disposed between the second sub-substrate layer 27 and the heat dissipation plate 7.

First conductive pads 15s, 15d, and 15g may be disposed on the first electrodes 13s, 13d, and 13g, respectively. The first conductive pads 15s, 15d, and 15g may include a first source conductive pad 15s, a first drain conductive pad 15d, and a first gate conductive pad 15g. The first source conductive pad 15s may contact the first source electrode 13s. The first drain conductive pad 15d may contact the first drain electrode 13d. The first gate conductive pad 15g may contact the first gate electrode 13g.

In the second region R2, second conductive pads 15a, 15b, and 15c may be disposed on the heat dissipation plate 7. The second conductive pads 15a, 15b, and 15c may include a second-a conductive pad 15a, a second-b conductive pad 15b, and a second-c conductive pad 15c. The first conductive pads 15s, 15d, and 15g and the second conductive pads 15a, 15b, and 15c may be made of, for example, the same conductive material. The first conductive pads 15s, 15d, and 15g and the second conductive pads 15a, 15b, and 15c may include at least one material of polysilicon doped with impurities, titanium, aluminum, gold, copper, tungsten, nickel, or platinum. Some of the first conductive pads 15s, 15d, and 15g and some of the second conductive pads 15a, 15b, and 15c may be electrically connected to each other.

The second element 103 may be bonded to the heat dissipation plate 7 in the second region R2 in a flip-chip bonding manner Particularly, the second element 103 may be bonded to the second conductive pads 15a, 15b, and 15c with a solder layer 17 therebetween. The solder layer 17 may include at least one of tin or lead. Alternatively, the second element 103 may be bonded to the second conductive pads 15a, 15b, and 15c with a bump including at least one metal selected from gold, copper, tin, and lead therebetween. The second-a conductive pad 15a may be electrically connected to the second source electrode 23s. The second-b conductive pad 15b may be electrically connected to the second gate electrode 23g. The second-c conductive pad 15c may be electrically connected to the second drain electrode 23d.

Although not shown, in the semiconductor device 200, an interlayer insulation layer covering the first element 101 and the second element 103 may further include at least one of a passivation layer and/or a mold layer.

In the semiconductor device 200 of FIG. 1, since the second element 103, which may be a gallium nitride field effect transistor, may be directly connected to the heat dissipation plate 7 made of diamond in the flip-chip bonding manner, heat generated in the second element 103 may be quickly dissipated to the outside. Thus, forward current characteristics of the second element 103 may be improved due to the reduction of thermal resistance in the second element 103, and the high temperature reliability may be improved.

In the semiconductor device 200 of FIG. 1, the first element, which may be a silicon field effect transistor, and the second element 103, which may be a gallium nitride field effect transistor, may be connected to each other through the flip-chip bonding, a line connection length may be shortened to improve a signal transmission speed. Also, a horizontal size of the heat dissipation plate 7 may be reduced when compared to wire bonding connection.

Also, in the semiconductor device 200 of FIG. 1, the first substrate 5a may expose a surface of the heat dissipation plate 7 in the second region R2, and the first substrate 5a and the exposed surface of the heat dissipation plate 7 may be stepped so that the second element 103 is mounted on the exposed surface of the heat dissipation plate 7, thereby relatively reducing the entire thickness of the semiconductor device 200. Therefore, the highly integrated semiconductor device 200 having the improved reliability may be realized.

Figure 2:
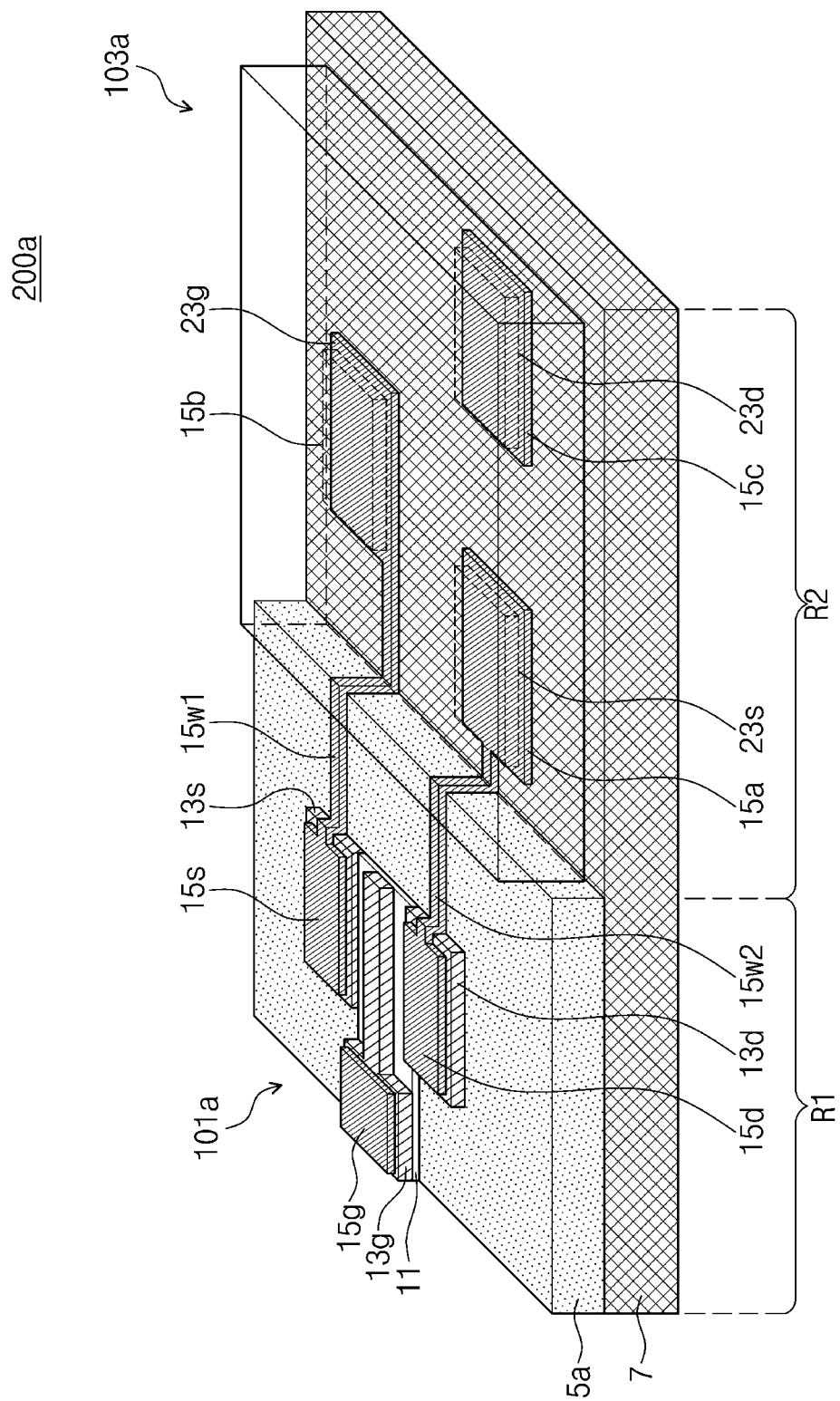
FIG. 2 is a perspective view of the semiconductor device according to embodiments of the inventive concept.

FIG. 2 is a perspective view of the semiconductor device according to embodiments of the inventive concept.

Referring to FIG. 2, a semiconductor device 200a according to this embodiment may further include a first line 15w1 connecting a first source conductive pad 15s to a second-b conductive pad 15b in the structure of FIG. 1. The semiconductor device 200a may further include a second line 15w2 connecting a first drain conductive pad 15d to a second-a conductive pad 15a. That is, a first source electrode 13s of a first element 101a may be electrically connected to a second gate electrode 23g of a second element 103a. Also, a first drain electrode 13d of the first element 101a may be electrically connected to a second source electrode 23s of the second element 103a. The first and second lines 15w1 and 15w2 may cover a sidewall of the first substrate 5a. Although not shown, an insulation layer may be disposed between the first and second lines 15w1 and 15w2 and the first substrate 5a. Other structures except for the above-described structure may be the same as or similar to those described with reference to FIG. 1. For example, the semiconductor device 200a may be a normally-on nitride semiconductor device using connection between a silicon field effect transistor and a cascode.

FIGS. 3 to 7 are cross-sectional views sequentially illustrating a process of fabricating the semiconductor device of FIG. 1.

Figure 3:
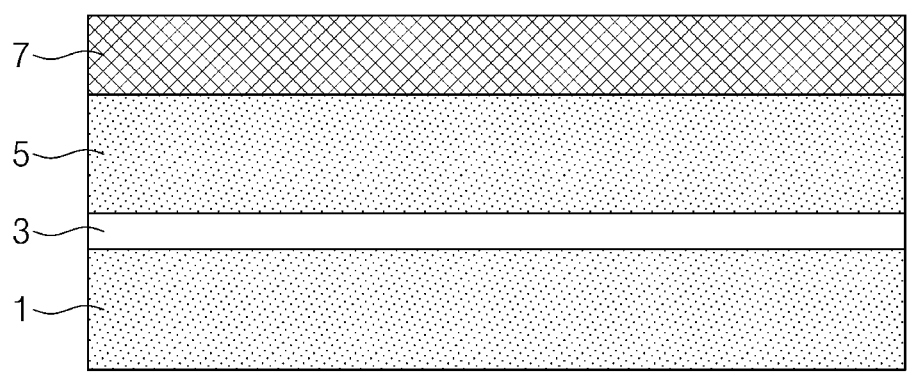
FIGS. 3 to 6 are cross-sectional views sequentially illustrating a process of fabricating the semiconductor device of FIG. 1.

Referring to FIG. 3, a separation layer 3 and a first substrate layer 5 are sequentially laminated on a sacrificial substrate 1. The separation layer 3 may be a silicon oxide layer. The sacrificial substrate 1 may be, for example, a silicon single crystal. A process of sequentially laminating the separation layer 3 and the first substrate layer 5 on the sacrificial substrate 1 may be performed by preparing a silicon on insulator (SOI) substrate. Alternatively, the separation layer 3 and the first substrate layer 5 may be sequentially laminated on the sacrificial substrate 1 through a deposition process. A process of removing a portion of the first substrate layer 5 so that the first substrate layer 5 has a desired thickness. For this, a chemical mechanical polishing process or a front etch-back process may be performed on the first substrate layer 5. The desired thickness of the first substrate layer 5 may be about 0.5 μm to about 3 μm.

Continuously, a heat dissipation plate 7 may be formed on the first substrate layer 5. The heat dissipation plate 7 may be formed by depositing diamond. The process of depositing the diamond may be performed, for example, in a thermal chemical vapor deposition (CVD) manner or a microwave CVD manner. In the process of depositing the diamond, a deposition temperature may be about 500° C. or more, more particularly, about 700° C. to about 1000° C. The heat dissipation plate 7 may have a thickness of about 50 μm to about 1 cm, more particularly, a thickness of about 100 μm to about 5 cm.

Figure 4:
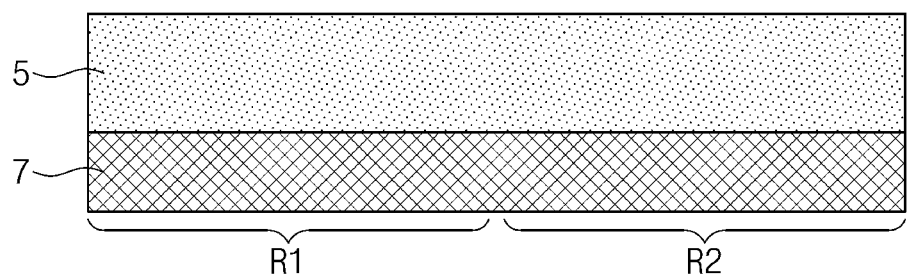

Referring to FIG. 4, the sacrificial substrate 1 and the separation layer 3 may be removed. The process of removing the sacrificial substrate 1 and the separation layer 3 may be performed through a wet/dry etching process or a mechanical lapping process. Thus, a surface of the first substrate layer 5 may be exposed. Also, the structure in which the heat dissipation plate 7 is laminated on the first substrate layer 5 may be overturned. Thus, a structure in which the first substrate layer 5 is disposed on the heat dissipation plate 7 may be realized. The heat dissipation plate 7 may have a first region R1 and a second region R2.

Figure 5:
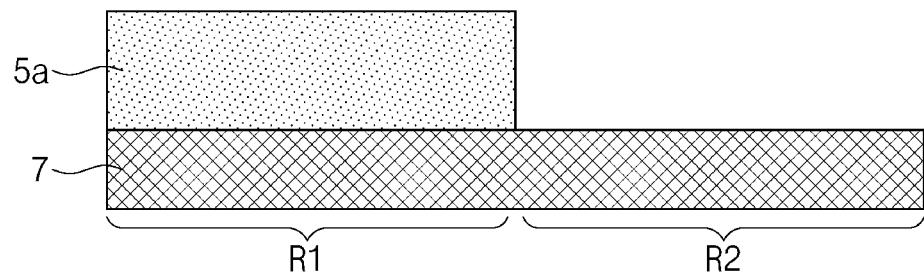

Referring to FIG. 5, although not shown, a mask pattern covering the first region R1 and exposing the second region R2 may be formed on the first substrate layer 5. The mask pattern may be, for example, a photoresist pattern. The first substrate layer 5 may be etched by using the mask pattern as an etch mask to form a first substrate 5a that covers the heat dissipation plate 7 in the first region R1 and exposes the heat dissipation plate 7 in the second region R2. Although not shown, an ion injection process may be performed to form impurity injection regions within the first substrate 5a.

Figure 6:
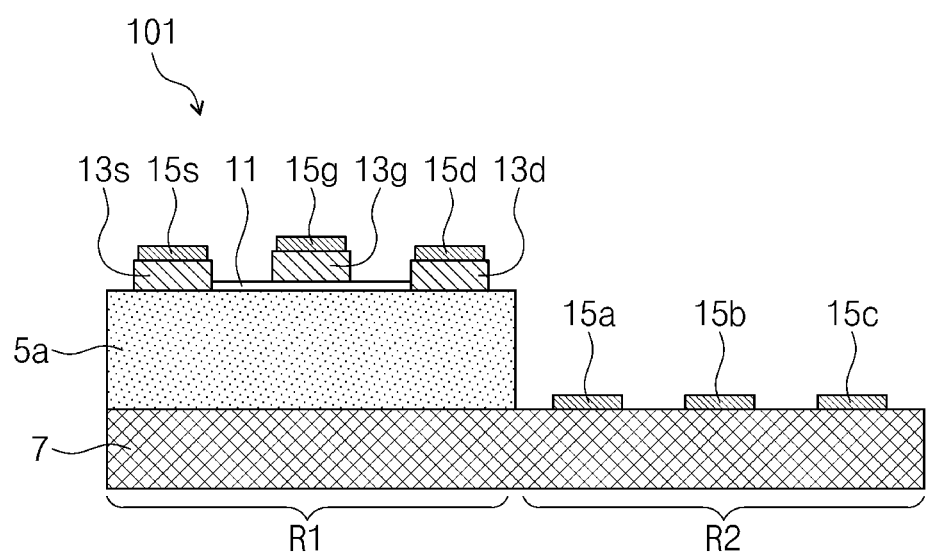

Referring to FIG. 6, a first gate insulation layer 11 may be formed on the first substrate 5a. The first gate insulation layer 11 may be formed through deposition and etching processes. The first gate insulation layer 11 may be formed to cover a portion of the first substrate 5a. First electrodes 13s, 13g, and 13d may be formed on the first substrate 5a. The first electrodes 13s, 13g, and 13d may be formed, for example, by depositing and etching a conductive layer. Alternatively, the first electrodes 13s, 13g, and 13d may be formed by supplying conductive paste in a screen printing or inkjet printing manner. The first electrodes 13s, 13g, and 13d may include a first source electrode 13s, a first gate electrode 13g, and a first drain electrode 13d. The first gate electrode 13g may be formed on the first gate insulation layer 11. Each of the first electrodes 13s, 13g, and 13d may be made of at least one material of polysilicon doped with impurities, titanium, aluminum, gold, copper, tungsten, nickel, or platinum. The first gate insulation layer 11 may be made of, for example, at least one of silicon oxide, silicon nitride, silicon oxynitride, or metal oxide.

Referring to FIGS. 6 and 2, first conductive pads 15s, 15g, and 15d may be formed on the first electrodes 13s, 13g, and 13d, respectively. Also, in the second region R2, second conductive pads 15a, 15b, and 15c may be formed on the heat dissipation plate 7. Here, the first line 15w1 and the second line 15w2 may be also formed. The first conductive pads 15s, 15g, and 15d, the second conductive pads 15a, 15b, and 15c, and the first and second lines 15w1 and 15w2 may be formed at the same time. The first conductive pads 15s, 15g, and 15d, the second conductive pads 15a, 15b, and 15c, and the first and second lines 15w1 and 15w2 may be formed by depositing and etching a conductive layer. Alternatively, the first conductive pads 15s, 15g, and 15d, the second conductive pads 15a, 15b, and 15c, and the first and second lines 15w1 and 15w2 may be formed by supplying conductive paste in a screen printing or inkjet printing manner Each of the first conductive pads 15s, 15g, and 15d, the second conductive pads 15a, 15b, and 15c, and the first and second lines 15w1 and 15w2 may include at least one material of polysilicon doped with impurities, titanium, aluminum, gold, copper, tungsten, nickel, or platinum.

Referring to FIG. 1, a second element 103 is prepared. The second element 103 may be, for example, a gallium nitride field effect transistor. The second element 103 may be the same as described above. The second element 103 may be mounted on the second conductive pads 15a, 15b, and 15c in a flip-chip bonding manner. That is, the second element 103 may be disposed on the heat dissipation plate 7 in the second region R2 so that a first surface 29a of a first sub-substrate layer 29 face a lower side, and a reflow process of applying heat in state in which a solder layer 17 is disposed between the second electrodes 23s, 23g, and 23d and the second conductive pads 15a, 15b, and 15c may be performed to bond the second element 103.

Figure 7:
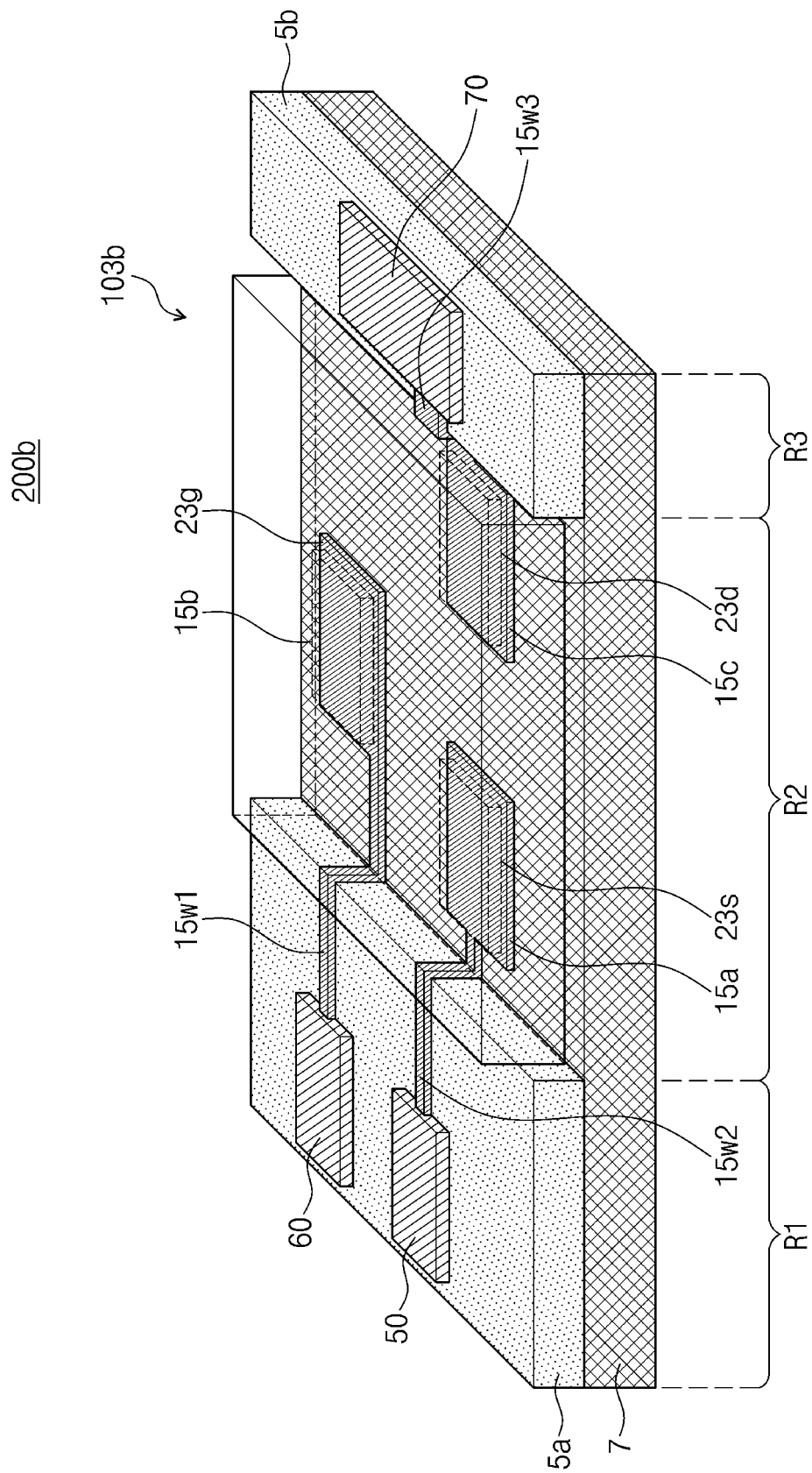
FIG. 7 is a perspective view of a semiconductor device according to embodiments of the inventive concept.

FIG. 7 is a perspective view of a semiconductor device according to embodiments of the inventive concept.

Referring to FIG. 7, in a semiconductor device according to this embodiment, a heat dissipation plate 7 may further include a third region R3. That is, the heat dissipation plate 7 may include a first region R1, a second region R2, and a third region R3, which are arranged in parallel to each other. A first substrate 5a may be disposed on the heat dissipation plate 7 in the first region R1. A third substrate 5b may be disposed on the heat dissipation plate 7 in the third region R3. The first substrate 5a and the third substrate 5b may be made of the same material, for example, a polysilicon single crystal. The second element 103b described with reference to FIG. 1 may be mounted on the heat dissipation plate 7 in the second region R2 in a flip-chip bonding manner.

A passive element may be disposed on the first substrate 5a and the third substrate 5b. Particularly, a first sub element 50 and a second sub element 60, which are spaced apart from each other, may be disposed on the first substrate 5a. The first sub element 50 may be, for example, a capacitor. The first sub element 50 may include, for example, two electrodes and a dielectric disposed between the two electrodes. The second sub element 60 may be, for example, an inductor. The second sub element 60 may include a coil-shaped structure. A third element 70 may be disposed on the third substrate 5b. The third element 70 may be, for example, a resistor. The second sub element 60 may be electrically connected to a second gate electrode 23g of the second element 103b by a first line 15w1. The first sub element 50 may be electrically connected to a second source electrode 23s of the second element 103b by a second line 15w2. The third element 70 may be electrically connected to a second drain electrode 23d of the second element 103b by a third line 15w3. The semiconductor device 200b may be an RF device or a monolithic microwave integrated circuit (MMIC). Other structures except for the above-described structure may be the same as or similar to those described above.

In the semiconductor device 200b, the first substrate 5a and the third substrate 5b may be formed at the same time by etching the first substrate layer 5 in the process illustrated in FIGS. 4 and 5. Other fabrication processes may be similar to those described with reference to FIGS. 6 and 1.

In the method for fabricating the semiconductor device according to the inventive concept, since the processes for the passive element, which are required for the MMIC and the like, are performed on the relatively inexpensive silicon layer instead of the relatively expensive nitride semiconductor, fabrication cost per unit area may be reduced, and device yield may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method for fabricating a semiconductor device, the method comprising:
    sequentially laminating a separation layer and a first substrate layer on a sacrificial substrate;
    forming a heat dissipation plate comprising a first region and a second region on the first substrate layer;
    removing the sacrificial substrate and the separation layer;
    patterning the first substrate layer to form a first substrate exposing the heat dissipation plate in the second region and contacting the heat dissipation plate in the first region;
    forming a first element on the first substrate;
    forming a plurality of conductive pads disposed on the heat dissipation plate in the second region and a first line connecting at least one of the plurality of conductive pads to the first element; and
    forming a second element on the conductive pads in the second region.

2. The method of claim 1, wherein the first substrate layer comprises a silicon layer, and the separation layer comprises a silicon oxide layer, and
    the sequentially laminating of the separation layer and the first substrate layer on the sacrificial substrate is performed by preparing a silicon on insulator (SOI) substrate.

3. The method of claim 1, wherein the forming of the heat dissipation layer comprises depositing diamond.

4. The method of claim 1, further comprising decreasing a thickness of the first substrate layer before the forming of the heat dissipation plate.

5. The method of claim 1, wherein the forming of the second element on the conductive pads in the second region is performed by a flip-chip bonding manner.

6. The method of claim 5, wherein the second element comprises a second substrate and second electrodes disposed on the second substrate and spaced apart from each other, and the method further comprises:
    connecting the second element to the conductive pads in the second region the connecting comprising interposing a solder layer to connect the conductive pads to the second electrodes.

7. The method of claim 1, wherein the heat dissipation plate further comprises a third region spaced apart from the first region with the second region between the first region and the third region, and
    the patterning of the first substrate layer further comprises forming a second substrate contacting the heat dissipation plate in the third region.

8. The method of claim 6, further comprising, before the connecting of the second element:
    forming a third element on the second substrate; and
    forming a second line connecting the conductive pads to the third element.

9. The method of claim 8, wherein the second element comprises a gallium nitride field effect transistor, and
    each of the first element and the third element comprises one selected from a capacitor, an inductor, and a resistor.

10. The method of claim 1, wherein the first element comprises a silicon field effect transistor, and
    the second element comprises a gallium nitride field effect transistor.

* * * * *